US012266402B2

(12) United States Patent  
Petroni et al.

(10) Patent No.: US 12,266,402 B2  
(45) Date of Patent: Apr. 1, 2025

(54) PHASE CHANGE MEMORY DEVICE WITH IMPROVED RETENTION CHARACTERISTICS AND RELATED METHOD

(71) Applicant: STMicroelectronics S.r.l., Agrate Brianza (IT)

(72) Inventors: Elisa Petroni, Sesto San Giovanni (IT); Andrea Redaelli, Milan (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 219 days.

(21) Appl. No.: 17/993,118

(22) Filed: Nov. 23, 2022

(65) Prior Publication Data

US 2023/0170022 A1 Jun. 1, 2023

(30) Foreign Application Priority Data

Nov. 30, 2021 (IT) .................. 102021000030293

(51) Int. Cl.
*G11C 13/00* (2006.01)
*H10N 70/00* (2023.01)
*H10N 70/20* (2023.01)

(52) U.S. Cl.
CPC ....... *G11C 13/0069* (2013.01); *H10N 70/231* (2023.02); *H10N 70/8413* (2023.02); *H10N 70/8828* (2023.02)

(58) Field of Classification Search
CPC ............ G11C 13/0069; G11C 13/0004; G11C 2013/0078; G11C 11/56; H10N 70/231;

(Continued)

(56) References Cited

U.S. PATENT DOCUMENTS 8,809,829 B2 * 8/2014 Lee ...................... H10N 70/826  
                                                            438/129  
8,946,666 B2 * 2/2015 Cheng .................. H10N 70/026  
                                                            438/102

(Continued)

FOREIGN PATENT DOCUMENTS

EP           2402953 A1    1/2012

OTHER PUBLICATIONS

Zhang, Wei, et al.: "Unveiling the Structural Origin to Control Resistance Drift in Phase-Change Memory Materials," Materials Today, vol. 41, Dec. 2020, pp. 156-176.

(Continued)

*Primary Examiner* — Jay W. Radke  
(74) *Attorney, Agent, or Firm* — Crowe & Dunlevy LLC (57) ABSTRACT

A phase change memory element has a memory region, a first electrode and a second electrode. The memory region is arranged between the first and the second electrodes and has a bulk zone and an active zone. The memory region is made of a germanium, antimony and tellurium based alloy, wherein germanium is in a higher percentage than antimony and tellurium in the bulk zone of the memory region. The active zone is configured to switch between a first stable state associated with a first memory logic level and a second stable state associated with a second memory logic level. The active zone has, in the first stable state, a uniform, amorphous structure and, in the second stable state, a differential polycrystalline structure including a first portion, having a first stoichiometry, and a second portion, having a second stoichiometry different from the first stoichiometry.

19 Claims, 6 Drawing Sheets

(58) Field of Classification Search
CPC .......... H10N 70/8413; H10N 70/8828; H10N 70/826
See application file for complete search history.

(56) References Cited

U.S. PATENT DOCUMENTS

| | | | | |
|---|---|---|---|---|
| 2010/0314601 | A1* | 12/2010 | Lee | H10N 70/026 |
| | | | | 438/103 |
| 2012/0326111 | A1* | 12/2012 | Cheng | H10N 70/026 |
| | | | | 252/62.3 V |
| 2015/0371704 | A1 | 12/2015 | Khwa et al. | |
| 2016/0371582 | A1* | 12/2016 | Eleftheriou | G06N 3/049 |
| 2016/0379110 | A1* | 12/2016 | Eleftheriou | G06N 3/049 |
| | | | | 706/33 |
| 2017/0270404 | A1* | 9/2017 | Eleftheriou | G11C 13/0004 |
| 2018/0068217 | A1* | 3/2018 | Eleftheriou | G06N 3/049 |
| 2021/0226123 | A1* | 7/2021 | Yuan | H10N 70/8613 |
| 2023/0027575 | A1* | 1/2023 | Lee | G11C 13/0004 |

OTHER PUBLICATIONS

Padilla, Alvaro, et al.: "Voltage Polarity Effects in Ge2Sb2Te5-Based Phase Change Memory Devices," Journal of Applied Physics 110, 054501 (2011); https://doi.org/10.1063/1.3626047, 12 pgs.
Redaelli, Andrea, et al.: "Materials Science in Semiconductor Processing," Materials Science in Semiconductor Processing, vol. 137, Jan. 2022, 106184, 8 pgs.
IT Search Report and Written Opinion for priority application, IT Appl. 102021000030293, report dated Jun. 15, 2022, 10 pgs.

\* cited by examiner

PHASE CHANGE MEMORY DEVICE WITH IMPROVED RETENTION CHARACTERISTICS AND RELATED METHOD

PRIORITY CLAIM

This application claims the priority benefit of Italian Application for Patent No. 102021000030293, filed on Nov. 30, 2021, the content of which is hereby incorporated by reference in its entirety to the maximum extent allowable by law.

TECHNICAL FIELD

Embodiments herein relate to a phase change memory device with improved retention characteristics and a related method.

BACKGROUND

As is known, non-volatile phase-change memories (PCMs) use materials that can switch between two or more stable phases characterized by different electrical properties. For instance, such materials are able to switch between a disorderly, amorphous, phase and an orderly, crystalline or polycrystalline phase, and the two phases are associated with resistivities having considerably different values that may be used to store data.

To this end, the elements of Group VI of the Periodic Table, such as tellurium (Te), selenium (Se), germanium (Ge) or antimony (Sb), referred to as chalcogenides or chalcogenic materials, are commonly used.

Figure 1:
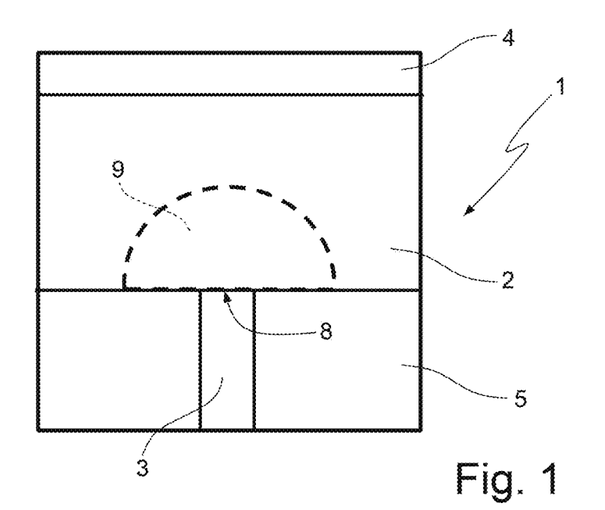
FIG. 1 is a cross-section of a phase change memory element.

Phase changes are obtained by locally increasing the temperature of the cells of chalcogenic material, through resistive electrodes (generally known as heaters) arranged in contact with respective regions of chalcogenic material. For example, FIG. 1 shows a cross-section of a typical phase change memory element 1, with a wall-shaped heater.

Phase change memory element 1 includes a memory region 2 of a chalcogenic material, in contact with a first electrode 3, here a bottom electrode, and with a second electrode 4, here an upper electrode.

Memory region 2 may be made of a $Ge_xSb_yTe_z$ alloy (also known as GST), for example $Ge_2Sb_2Te_5$.

Electrodes 3, 4 are made of an electrically conductive material, for example TiN or TaN. The first electrode 3 has a lesser width than the second electrode 4. For example, the first electrode 3 may have a width of a few nanometers and be formed in a pore or in an elongated trench in a dielectric layer 5 (the latter configuration, also called wall configuration). Due to its reduced width, current flowing in the first electrode 3 is concentrated and causes heating of a portion 9 of the memory region 2 above a contact area 8. Thus, first electrode 3 forms a heater.

Portion 9 of the memory region 2 above contact area 8 (delimited in FIG. 1 by a dotted line), when heated, undergoes phase change and forms an active portion 9.

A selection device (for example, a MOSFET, not shown) is connected to the first electrode/heater 3 and enables passage of an electric program/reset current. The electric current, by Joule effect, heats the chalcogenic material to obtain the desired temperature for phase-change.

Figure 2A:
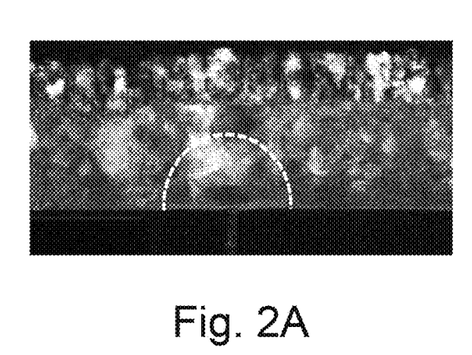
FIGS. 2A and 2B are images obtained through dark-field (DF) scanning transmission electron microscope (STEM) of the phase change memory element of FIG. 1 in the set state and the reset state, respectively.

In particular, to program the phase change memory element 1 to its crystalline state (low resistance state, also called set state), an electrical pulse is applied to heat the memory region 2 above its crystallization temperature. By allowing the memory region 2 to slowly cool down to normal operating temperature, the phase change portion 9 maintains the polycrystalline phase. See, e.g., FIG. 2A.

Figure 2B:
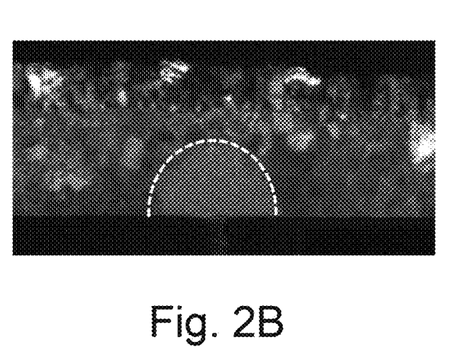

To reset the phase change memory element 1 to the amorphous phase (high resistance state, also called reset state), the material is first heated to a higher temperature than during programming in order to melt it. By abruptly cutting off the electrical current pulse, the phase-change material quenches into its amorphous phase. See, e.g., FIG. 2B.

Figure 3:
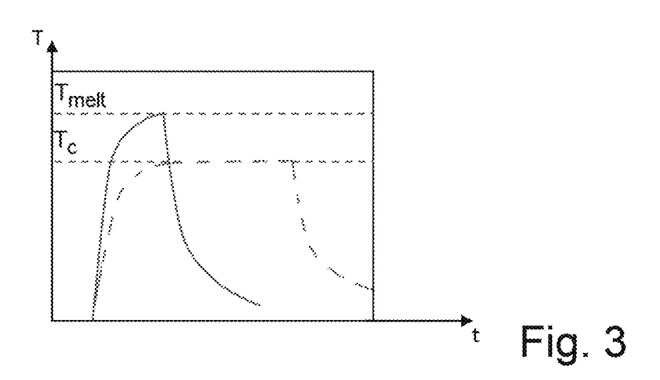
FIG. 3 shows exemplary plots of temperatures versus. time during set/reset operations of the phase change memory cell of FIG. 1.

FIG. 3 shows exemplary plots of temperature T as a function of time t desired for programming operations associated with a reset pulse (continuous line) and a set pulse (dotted line) in the ideal condition of uniform temperature in the whole memory region 2. In fact, a decreasing temperature gradient is present, from the first electrode 3 to the second electrode 4. In any case, active portion 9 follows the shown behavior reported in FIG. 3, and its temperature is equal or higher than those reported in FIG. 3.

During reading, the state of the chalcogenic material is detected by applying a voltage that is sufficiently low as avoid a considerable heating, and then by reading the current flowing in the memory element 1. Since the current is proportional to the conductivity of phase change memory element 1, it is possible to determine in which state the phase change memory element is and therefore to get the datum stored in the memory element.

Memories including phase change memory elements are one of the most promising type of memory due to their easy integration with advanced logics and their costs, but their reliability is still not sufficient to meet the strict requirements existing in some applications, such as in the automotive field, where the thermal treatments provided therein may cause low data retention.

Thus, there is a need in the art to provide a phase-change memory device having a higher data retention capability.

SUMMARY

An embodiment provides a phase change memory element comprising: a memory region, a first electrode, and a second electrode, wherein the memory region is arranged between the first and the second electrodes, and having a bulk zone and an active zone. The memory region is made of a germanium, antimony and tellurium based alloy, with an average percentage of germanium in the memory region higher than 50%. The active zone is configured to switch between a first stable state associated with a first memory logic level and a second stable state associated with a second memory logic level. The active zone has, in the first stable state, a uniform, amorphous structure and, in the second stable state, a differential polycrystalline structure including a first portion, having a first stoichiometry, and a second portion, having a second stoichiometry, different from the first stoichiometry.

Another embodiment provides a phase change memory device comprising: a plurality of memory cells, each memory cell including a phase change memory element as described above. The memory device comprises circuit elements configured to bias the phase change memory elements of the memory cells and to cause the phase change memory elements of addressed memory cells to switch between the first and the second stable state.

Yet another embodiment provides a method for programming a phase change memory element as described above, comprising: selectively supplying the phase change memory element with a bias pulse selected from a first bias pulse and a second bias pulse, the first bias pulse causing the memory element to switch in the first stable state, and the second bias pulse causing the memory element to switch in the second stable state; wherein the first and second bias pulses have a respective height and a respective fall time, the height of the first pulse being greater than the height of the second pulse and the fall time of the first pulse being shorter than the fall time of the second pulse.

BRIEF DESCRIPTION OF THE DRAWINGS

For the understanding of the present invention, embodiments thereof are now described, purely as a non-limitative example, with reference to the enclosed drawings, wherein.

DETAILED DESCRIPTION

Figure 4:
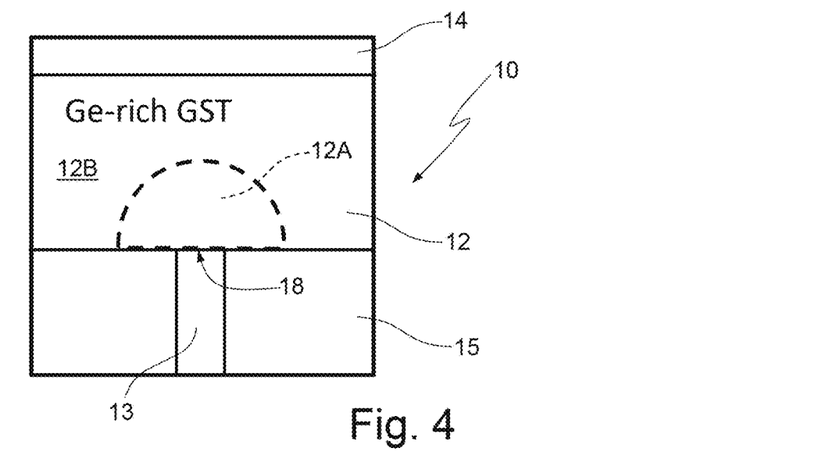
FIG. 4 is a cross-section of a phase change memory element, according to an embodiment.

FIG. 4 shows a phase change memory element (hereafter, memory element 10) including a memory region 12 in contact with a first electrode (also called heater 13) and a second electrode 14 (also called upper electrode 14).

As discussed in detail hereinbelow, memory region 12 is made of a Ge-rich GST alloy, that is an alloy that has general formula $Ge_xSb_yTe_z$ but is not stoichiometric.

The heater 13 has a small width (even a few nanometers) and is formed in a dielectric layer 15. The contact area between the heater 13 and the memory region 12 is indicated at 18.

As shown in FIG. 4, memory region 12 has a portion 12A above contact area 18; portion 12A (delimited in FIG. 4 by a dotted line) is configured to undergo phase change and thus forms an active zone 12A, surrounded by a bulk portion 12B of the memory region 12.

Figure 5:
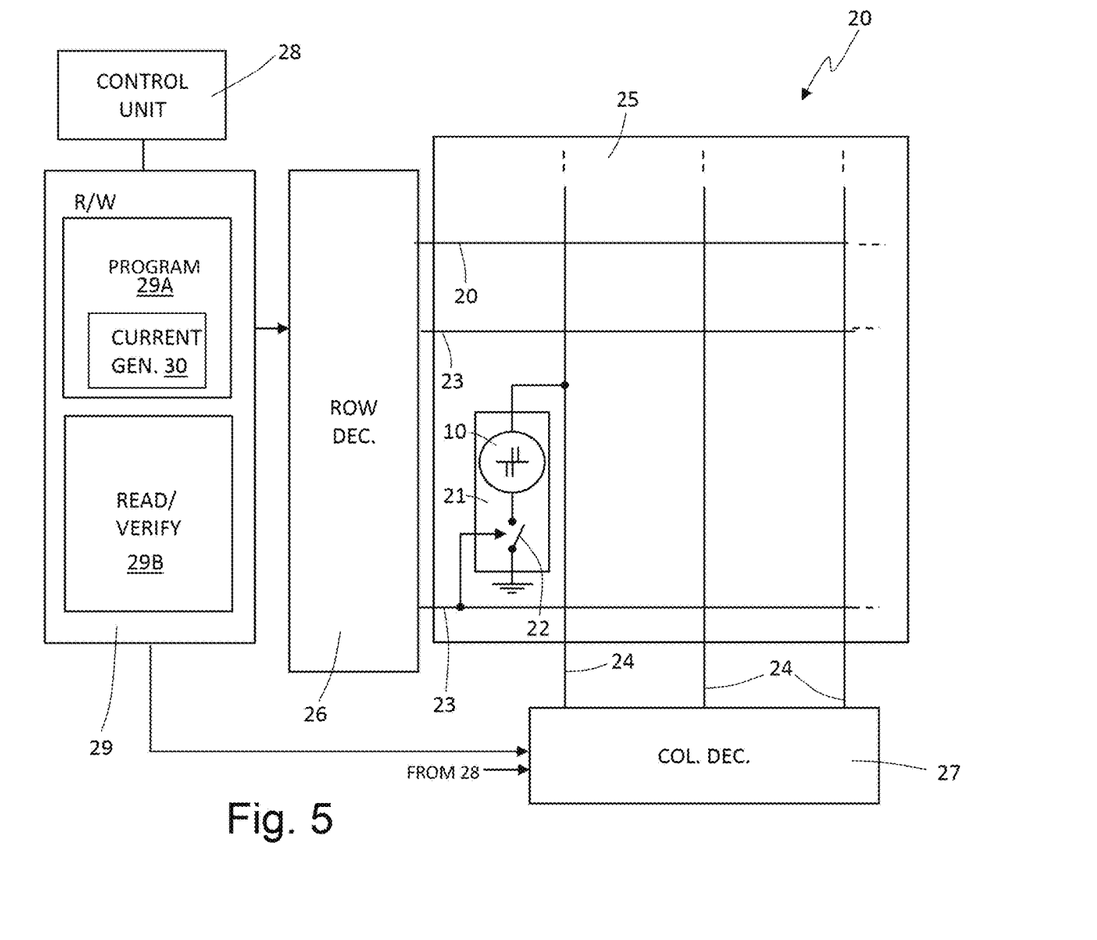
FIG. 5 is a schematic block diagram of a non-volatile memory including phase change memory elements.

Memory element 10 is generally coupled to a selection element to form a memory cell, as shown in FIG. 5, wherein the memory cell is designated by 21 and selection element is designated by 22.

FIG. 5 shows a phase change memory 20 comprising a memory array 25 including a plurality of memory cells 21. In each memory cell 21, memory element 10 and selection element 12, here illustrated as a switch, are series-coupled. Selection element 12 may be implemented through any suitable component, such as a diode, a bipolar transistor, a MOSFET transistor, as known in the art.

Memory cells 21 are generally organized in rows and columns and are coupled, through a plurality of wordlines 23 and a plurality of bitlines 24, to a row decoder 26 and to a column decoder 27. Decoders 26, 27 enable selection of the memory cells 21, on the basis of address logic signals and more or less complex decoding schemes; in particular, they select the memory cell(s) 21 coupled to one or more wordlines 23 and one or more bitlines 24 that are addressed by the decoders 26, 27.

Column decoder 26 and row decoder 27 are coupled to a control unit 28 and to a read/program unit 29. Read/program unit 29 may include a program circuit 29A and a read/verify circuit 29B.

The program circuit 29A is configured to provide programming pulses (set or reset pulses) to selected memory cells 21. To this end, it comprises a current generator circuit 30. The read/verify circuit 29B is connected to the selected memory cells 21 for reading the information stored therein (e.g., to implement a verify operation after each programming pulse). Reading may be carried out by comparing the currents from one or more suitably biased memory cells 21 with read current reference levels (during a reading operation) or to program current reference levels (during a verify operation).

As indicated above, this disclosure regards a memory element 10 having a memory region 12 of a Ge-rich GST alloy.

Herein, the term "Ge-rich GST" indicates a GST alloy wherein germanium (Ge) is a predominant component of the average composition. In particular, the percentage of Ge in the GST alloy may be higher than 50%. Bulk zone 12B has the average percentage.

In an embodiment, a first alloy, characterized by composition including 70% Ge, 10% Sb and 20% Te (referred to as GST 712) may be used.

In another embodiment, a second alloy, characterized by composition including 65% Ge, 20% Sb and 15% Te (referred to as GST 621) may be used.

However, other Ge-rich GST alloys may be used.

In a per se known manner, the GST alloy may include nitrogen and/or other residual ions that do not alter the basic working principles and the physical features of the GST alloy in terms of ions chemical and morphological distribution.

By studying the properties of Ge-rich GST alloys, the inventors have discovered that the Ge-rich GST alloys, if programmed in the polycrystalline state by a programming pulse having a slow quenching pulse, have locally different compositions (portions with different stoichiometries). Thus, logic levels of Ge-rich memory element 10 may be associated with polycrystalline structures having, in the active zone, a plurality of locally different compositions (locally different polycrystalline structures).

Thus, according to an embodiment, in the set state, the active zone 12A of memory element 10 comprises a first portion that has a first stoichiometry, and a second portion that has a second stoichiometry, different from the first stoichiometry.

The first portion (hereinafter called core portion 31, see also FIG. 7) is characterized by a local high concentration of Sb; the second portion (hereinafter called shell portion 32) is characterized by a local high concentration of Te.

In particular, the percentage of Sb in the core portion 31 is higher than the percentage of Sb in the bulk portion 12B and the percentage of Te in the shell portion 32 is higher than the percentage of Te in the bulk portion 12B.

In addition, the percentage of Sb in the core portion 31 is at least twice the percentage of Sb in the bulk portion 12B; in particular, in the case of the first alloy, the percentage of Sb in the core portion 31 may be at least four times.

Furthermore, the percentage of Te in the shell portion 32 is at least twice than the percentage of Te in the bulk portion 12B.

Figure 6:
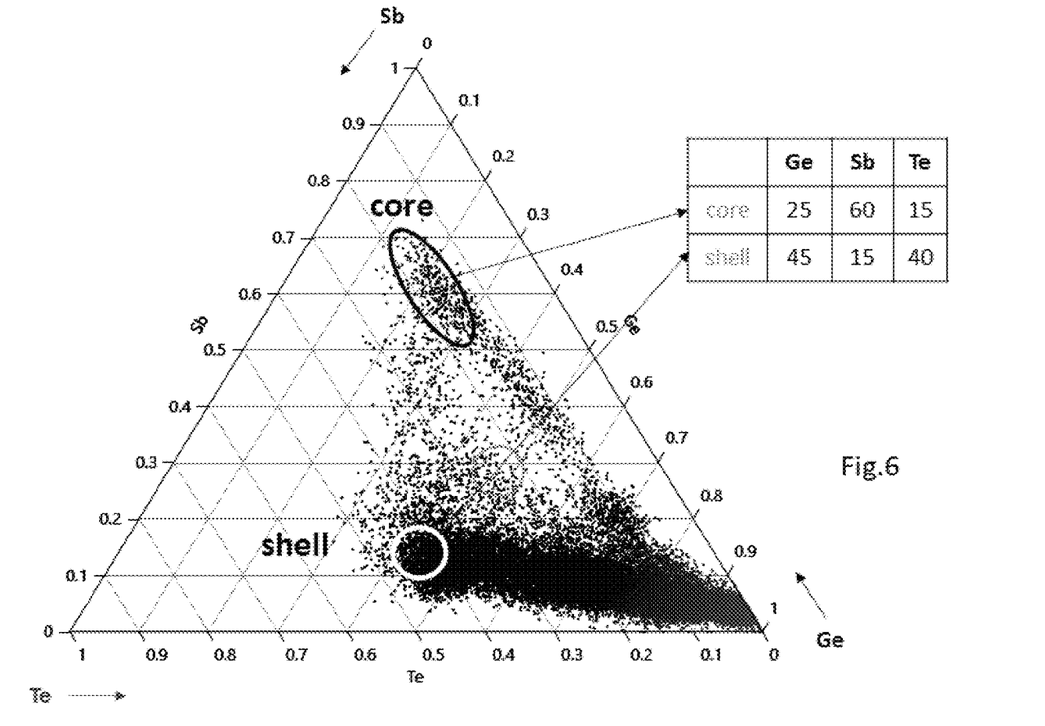
FIG. 6 is a compositional phase diagram of relative amounts of ions in the memory phase change memory element of FIG. 4 programmed in the set state, according to an embodiment.
Figure 7:
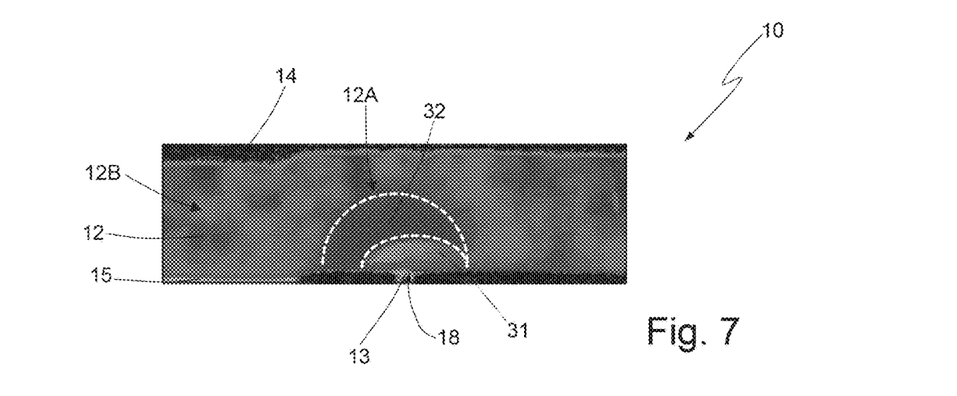
FIG. 7 shows an image obtained through Electron Energy Loss Spectroscopy performed by scanning transmission electron microscope (STEM-EELS) of the phase change memory element of FIG. 4 programmed in the set state.

This is shown in FIGS. 6 and 7 for a memory element 10 whose memory region 12 is made of the above indicated first alloy.

Specifically, FIG. 6 shows the compositional phase diagram of relative amounts of Te, Sb, and Ge in the memory region 12 of memory element 10 of FIG. 4 programmed in the set state and FIG. 7 shows a STEM-EELS image of the obtained chemical map.

In particular, FIG. 6 shows that the core portion 31 has an Sb rich composition, with the percentage of Sb very high, higher than the percentages of Ge and Te, while shell portion 32 has a Te rich composition, wherein the percentage of Te is much higher than in the bulk zone 12B and, for the first alloy, comparable to the Ge percentage, considering the error of the technique and a 4-5% variability of the measurement.

FIG. 7 shows clearly the presence, in the memory region 12, of core portion 31, near the heater 13, and shell portion 32. Thus, core portion 31 and shell portion 32 form the active zone 12A of FIG. 4.

As visible also in FIG. 7, core portion 31 extends, dome-shaped, above the heater 13, and shell portion 32 extends deeper in the memory region 12, towards the upper electrode 14, surrounding almost completely core portion 31.

Both the core portion 31 and the shell portion 32 have a polycrystalline structure.

Figure 8:
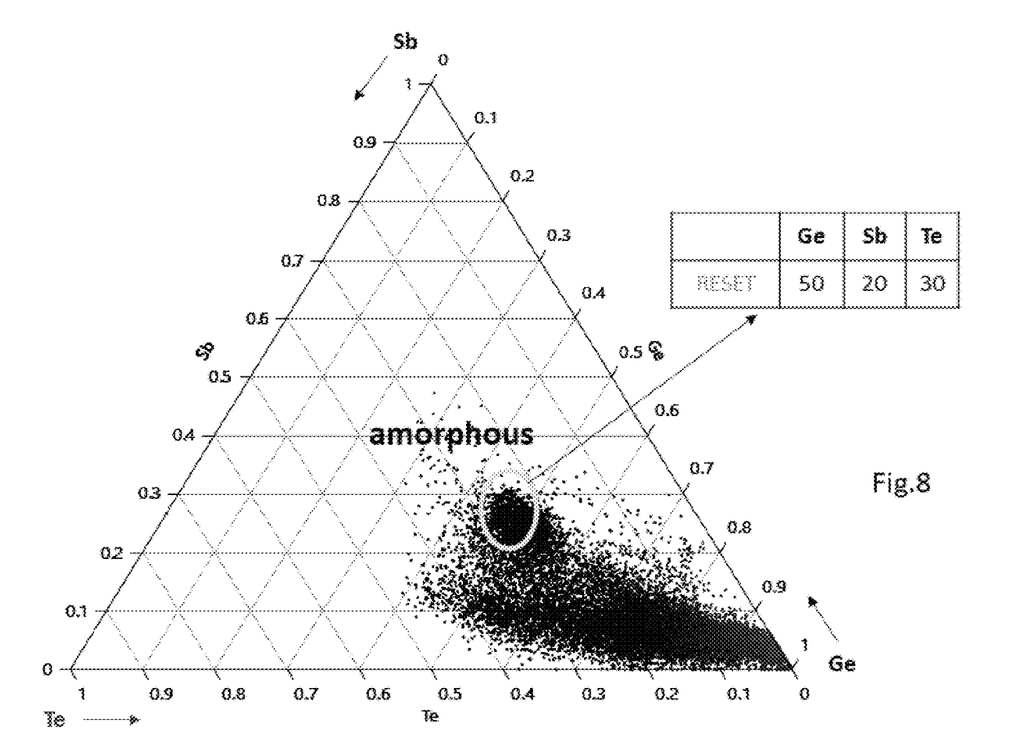
FIG. 8 is a compositional phase diagram of relative amounts of ions in the phase change memory element of FIG. 4 programmed in the reset state, according to an embodiment.
Figure 9:
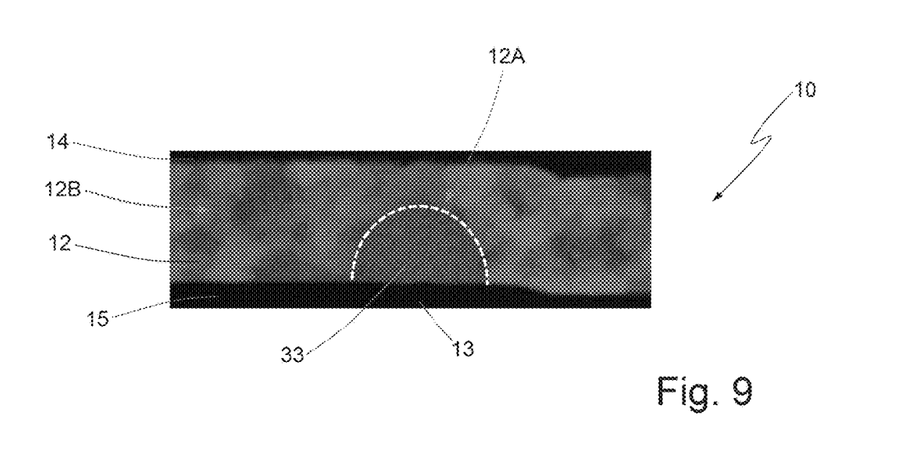
FIG. 9 shows an image obtained through Electron Energy Loss Spectroscopy performed by scanning transmission electron microscope (STEM-EELS) of the phase change memory element of FIG. 4 programmed in the reset state.

FIGS. 8 and 9 show the compositional phase diagram of relative amounts of Te, Sb, and Ge in the memory region 12 of the same memory element 10 of FIG. 4 programmed in the reset state and a STEM-EELS image of the obtained chemical map.

As visible in FIG. 9, active zone 12A here forms an amorphous portion 33 having a uniform composition, wherein neither an Sb rich portion nor a Te rich portion is any more visible.

In particular, as visible in the compositional phase diagram of FIG. 8, amorphous portion 33 has a composition that is substantially uniform in the active area 12A, with a well-defined distribution, clearly separated from the distribution in the bulk zone 12B, with limited dispersion.

According to an embodiment, in use, memory device 20 of FIG. 5 is configured to generate programming pulses able to cause switching of the memory element 10 between the polycrystalline, differential stoichiometry state shown in FIGS. 6 and 7 (set state, associated with a first logic value, for example with a logic 0) and the amorphous, uniform distribution state shown in FIGS. 8 and 9 (reset state, associated with a second logic value, for example with a logic 1).

Figure 10:
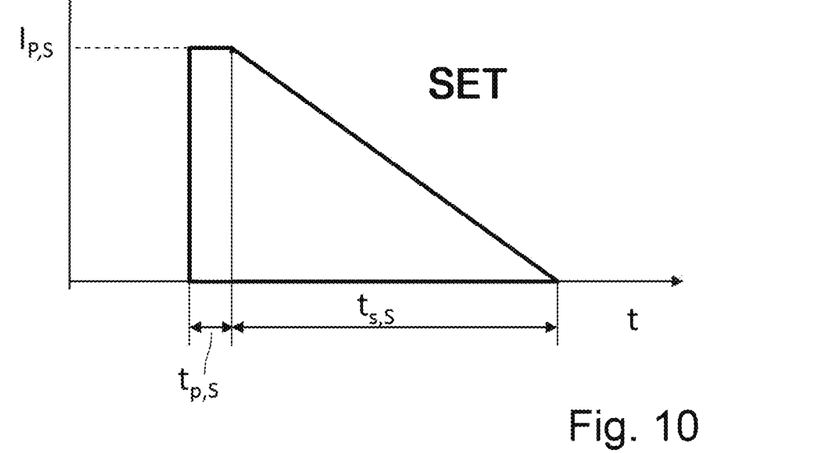
FIGS. 10 and 11 show current pulses to program the phase change memory element in the set and, respectively, in the reset state, according to an embodiment.
Figure 11:
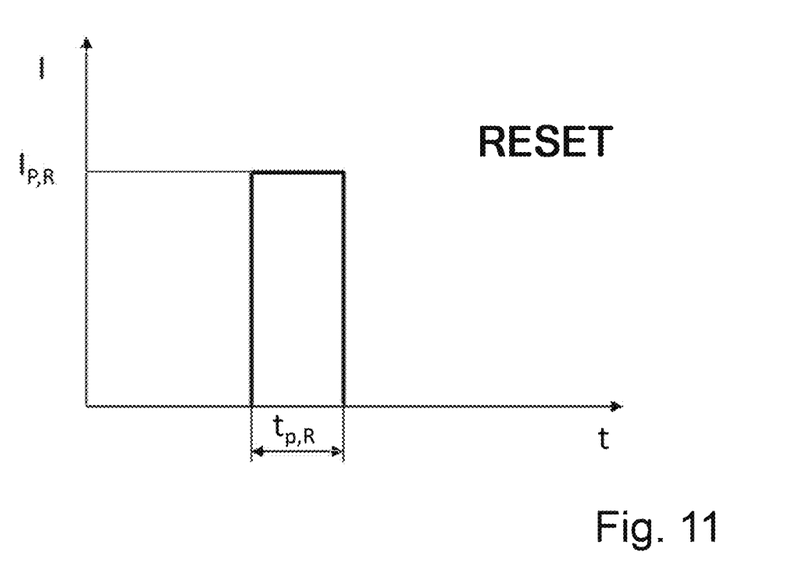

The set/reset states of memory elements 10 may obtained by applying a slow quenching pulse to get the polycrystalline, set state, and a fast quenching pulse to get the amorphous, reset state with uniform composition, as shown in FIGS. 10 and 11.

For example, Table 1 below indicates possible programming pulses, wherein $I_{P,S}$ is the plateau current during the set operation, $I_{P,R}$ is the plateau current during the reset operation, $t_{r,S}$ is the rise time of the pulse during the set operation, $t_{r,R}$ is the rise time of the pulse during the reset operation, $t_{p,S}$ is the plateau time of the pulse during the set operation, $t_{p,R}$ is the plateau time of the pulse during the reset operation, $t_{f,S}$ is the fall time of the pulse during the set operation, $t_{f,R}$ is the fall time of the pulse during the reset operation, $sl_S$ is the falling slope of the pulse during the set operation, and $sl_R$ is the falling slope of the pulse during the reset operation.

TABLE 1

|  | SET | RESET |
| --- | --- | --- |
| $I_{P,S}/I_{P,R}$ | 50-300 µA | 100-400 µA |
| $t_{P,S}/t_{P,R}$ | 100-200 ns | 50-300 ns |
| $t_{r,S}/t_{r,R}$ | ≤30 ns | ≤30 ns |
| $t_{f,S}/t_{f,R}$ | 2-6 µs | ≤30 ns |
| $sl_S/sl_R$ | 45-150 µA/µs | ≤10 µA/ns |

In particular, the plateau current $I_{P,S}$ during the set operation is generally lower than the plateau current $I_{P,R}$ during the reset operation.

In addition, the fall time $t_{f,S}$ during the set operation is much longer than the fall time $t_{f,R}$ during the reset operation. Specifically, the fall time $t_{f,S}$ during the set operation may be at least ten times, for example almost 100 times the fall time $t_{f,R}$ during the reset operation.

With reference again to FIG. 5, the current generator circuits 30, under control of the control unit 28 and the program circuit 29A, may generate the slow quenching pulses to get the polycrystalline, set state (FIG. 10) and the fast quenching pulses to get the amorphous, reset state with uniform composition (FIG. 11).

In particular, in the set operation, a positive voltage is applied to the second electrode 14, thereby drawing Sb ions (that are positively charged) toward the contact area 18, thereby causing formation of the core portion 31. Te ions, that are negatively charged, remain mainly on top of the core portion 31, forming the shell portion 32.

Testing has shown that the presence, in the set state, of highly conductive Sb in the core portion 31 allows the memory element 10 to show enhanced conduction.

On the other hand, the uniform, Ge-rich distribution in the memory region 12 reached in the reset state allows the memory element 10 to be very stable and have a high retention time.

The memory element 10 including a memory region 12 having a strong, non-stoichiometric, Ge-rich alloy discussed above, programmable to switch between the above discussed set and reset states, has thus improved performances as regards retention and reliability, that may satisfy the high automotive requirements.

Therefore, the memory element 10 is soldering resistant, so that any data written in the memory device 10 before soldering are not lost.

In addition, the memory element 10 has high scalability, since the programming currents scale with cell area reduction.

Moreover, the memory element 10 is versatile, since the unipolar programming is suitable for both MOS or BJT selector technology.

Testing has also shown that memory element 10 with a Ge-rich memory region 12, appropriately programmed in the set state, has the discussed locally different compositions discussed above, independently on the technology used.

Figure 12:
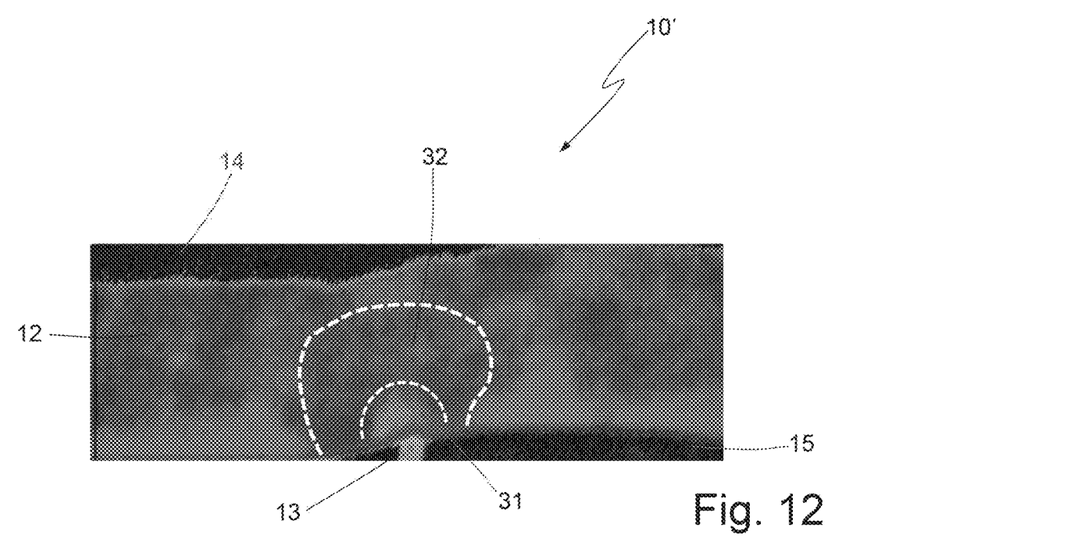
FIGS. 12 and 13 are images obtained through Electron Energy Loss Spectroscopy performed by scanning transmission electron microscope (STEM-EELS) of different phase change memory elements programmed in the set state.
Figure 13:
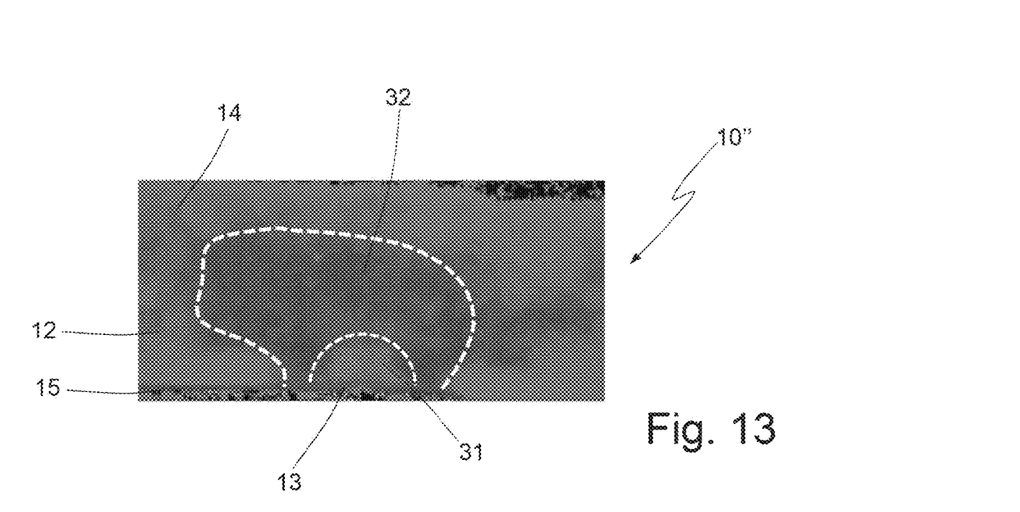

For example, FIGS. 12 and 13 show two different memory elements 10', 10" programmed in the set state, having the general structure described with reference to FIG. 4 but with heaters 13 formed by different technologies and materials.

As may be seen in FIGS. 12 and 13, also memory elements 10', 10" have a differential structure, with a core 31 which is Sb-rich and a shell 32 which is Te-rich.

Here, in both memory elements 10', 10", the shells 32 completely surround the respective core portions 31, except, of course, the face thereof in contact with the heater 13 and the dielectric layer 15.

Finally, it is clear that numerous variations and modifications may be made to the memory element, device and method described and illustrated herein, all falling within the scope of the invention as defined in the attached claims.

For example, even if the above description refers to the heater formed in the wall configuration, any shape of the electrode suitable to heat the memory region to cause switching between the set and the reset state may be used.

The invention claimed is:

1. A phase change memory element, comprising:
    a memory region having a bulk zone and an active zone, the memory region being made of a germanium, antimony and tellurium based alloy with an average percentage of germanium in the memory region higher than 50%;
    a first electrode;
    a second electrode;
    wherein the memory region is arranged between the first and the second electrodes;
    wherein the active zone of the memory region is adjacent the first electrode and covered by the bulk zone;
    wherein the active zone of the memory region is configured to switch between a first stable state associated with a first memory logic level and a second stable state associated with a second memory logic level; and
    wherein the active zone of the memory region has, in the first stable state, a uniform, amorphous structure covered by the bulk zone and has, in the second stable state, a differential polycrystalline structure covered by the bulk zone, said differential polycrystalline structure comprising a first portion having a first stoichiometry and a second portion having a second stoichiometry, wherein the second stoichiometry is different from the first stoichiometry.

2. The phase change memory element according to claim 1, wherein the first stoichiometry of the first portion in the second stable state has a first percentage of antimony and a second percentage of tellurium, and the second stoichiometry of the second portion in the second stable state has a third percentage of antimony that is lower than the first percentage of antimony, and a fourth percentage of tellurium that is higher than the second percentage of tellurium.

3. The phase change memory element according to claim 2, wherein the first percentage of antimony for the first stoichiometry of the first portion of the active zone in the second stable state is higher than a fifth percentage of antimony in the bulk zone and wherein the fourth percentage of tellurium for the second stoichiometry of the second portion of the active zone in the second stable state is higher than a sixth percentage of tellurium in the bulk zone.

4. The phase change memory element according to claim 3, wherein the first percentage of antimony is at least twice the fifth percentage of antimony in the bulk zone.

5. The phase change memory element according to claim 3, wherein the fourth percentage of tellurium is at least twice the sixth percentage of tellurium in the bulk zone.

6. The phase change memory element according to claim 1, wherein the first portion of the active zone is adjacent the first electrode.

7. The phase change memory element according to claim 6, wherein the second portion of the active zone covers and is adjacent to the first portion of the active zone.

8. The phase change memory element according to claim 1, wherein the first portion of the active zone is dome-shaped and the second portion of the active zone is shell-shaped and at least partially covers and surrounds the dome-shaped first portion.

9. The phase change memory element according to claim 1, wherein a stoichiometry of the bulk zone is same in both the first stable state associated with the first memory logic level and the second stable state associated with the second memory logic level.

10. A memory device, comprising:
    a plurality of memory cells;
    wherein each memory cell includes a phase change memory element comprising:
        a memory region having a bulk zone and an active zone, the memory region being made of a germanium, antimony and tellurium based alloy with an average percentage of germanium in the memory region higher than 50%;
        a first electrode;
        a second electrode;
        wherein the memory region is arranged between the first and the second electrodes;
        wherein the active zone of the memory region is adjacent the first electrode and covered by the bulk zone;
        wherein the active zone of the memory region is configured to switch between a first stable state associated with a first memory logic level and a second stable state associated with a second memory logic level; and
        wherein the active zone of the memory region has, in the first stable state, a uniform, amorphous structure covered by the bulk zone and has, in the second stable state, a differential polycrystalline structure covered by the bulk zone, said differential polycrystalline structure comprising a first portion having a first stoichiometry and a second portion having a second stoichiometry, wherein the second stoichiometry is different from the first stoichiometry; and
    circuit elements configured to bias the phase change memory elements of the memory cells and to cause the phase change memory elements of addressed memory cells to switch between the first second stable state and second stable state.

11. The memory device of claim 10, wherein said circuit elements are configured to program the phase change memory element by:
    selectively supplying the phase change memory element with a bias pulse selected from a first bias pulse and a second bias pulse;

wherein the first bias pulse, when selected, causes the memory element to switch in the first stable state;

wherein the second bias pulse, when selected, causes the memory element to switch in the second stable state; and wherein the first and second bias pulses have a respective height and a respective fall time, the height of the first bias pulse being greater than the height of the second bias pulse and the fall time of the first bias pulse being shorter than the fall time of the second bias pulse.

12. The memory device of claim 11, wherein the fall time of the second bias pulse is at least ten times the fall time of the first bias pulse.

13. The memory device of claim 11, wherein the fall time of the second bias pulse is about 100 times the fall time of the second bias pulse.

14. The memory device according to claim 11, wherein the first portion of the active zone is adjacent the first electrode.

15. The memory device according to claim 14, wherein the second portion of the active zone covers and is adjacent to the first portion of the active zone.

16. The memory device according to claim 14, wherein the first portion of the active zone is dome-shaped and the second portion of the active zone is shell-shaped and at least partially covers and surrounds the dome-shaped first portion.

17. The memory device according to claim 14, wherein a stoichiometry of the bulk zone is same in both the first stable state associated with the first memory logic level and the second stable state associated with the second memory logic level.

18. The phase change memory element according to claim 11, wherein the first stoichiometry of the first portion in the second stable state has a first percentage of antimony and a second percentage of tellurium, and the second stoichiometry of the second portion in the second stable state has a third percentage of antimony that is lower than the first percentage of antimony, and a fourth percentage of tellurium that is higher than the second percentage of tellurium.

19. The phase change memory element according to claim 18, wherein the first percentage of antimony for the first stoichiometry of the first portion of the active zone in the second stable state is higher than a fifth percentage of antimony in the bulk zone and wherein the fourth percentage of tellurium for the second stoichiometry of the second portion of the active zone in the second stable state is higher than a sixth percentage of tellurium in the bulk zone.

* * * * *